United States Patent
Fan et al.

(10) Patent No.: US 7,501,904 B2
(45) Date of Patent: *Mar. 10, 2009

(54) LOW POWER AND DUTY CYCLE ERROR FREE MATCHED CURRENT PHASE LOCKED LOOP

(75) Inventors: Yongping Fan, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 139 days.

This patent is subject to a terminal disclaimer.

(21) Appl. No.: 11/592,591

(22) Filed: Nov. 3, 2006

(65) Prior Publication Data

US 2008/0122545 A1    May 29, 2008

(51) Int. Cl.
*H03K 3/03* (2006.01)
(52) U.S. Cl. .................. 331/57; 331/177 R; 331/34; 331/185
(58) Field of Classification Search .................. 331/17, 331/57, 177 R, 185; 327/113, 114, 175, 327/264, 266, 291
See application file for complete search history.

(56) References Cited

U.S. PATENT DOCUMENTS

| | | | | |
|---|---|---|---|---|
| 5,767,748 A | * | 6/1998 | Nakao | 331/57 |
| 6,456,166 B2 | * | 9/2002 | Yabe | 331/34 |
| 7,202,715 B1 | * | 4/2007 | Fan | 327/149 |
| 7,248,125 B1 | * | 7/2007 | Talbot | 331/57 |
| 2001/0000426 A1 | * | 4/2001 | Sung et al. | 331/25 |
| 2004/0251973 A1 | * | 12/2004 | Ishida et al. | 331/16 |

* cited by examiner

*Primary Examiner*—Robert Pascal
*Assistant Examiner*—Ryan J. Johnson
(74) *Attorney, Agent, or Firm*—Seth Z. Kalson

(57) ABSTRACT

A phase locked loop with a voltage controlled oscillator, where the voltage controlled oscillator includes a feedback loop and delay cells connected in a ring. Each delay cell has a biased pMOSFET to provide pull-up current and a biased nMOSFET to provide pull-down current. For each delay cell, the gate of the biased nMOSFET is biased by the control voltage provided by the phase locked loop, and the gate of the biased pMOSFET is biased at a bias voltage provided by the feedback loop. The biasing of the pMOSFETs is adjusted so that the pull-up and pull-down currents for each delay cell are matched, thereby providing a 50% duty cycle and good jitter performance over process, supply voltage variations, and temperature variations. Because only the feedback loop has non-zero static current, low power is expected. Other embodiments are described and claimed.

11 Claims, 3 Drawing Sheets

LOW POWER AND DUTY CYCLE ERROR FREE MATCHED CURRENT PHASE LOCKED LOOP

FIELD

Embodiments of the present invention relate to electronic circuits, and more particularly, to phase locked loops.

BACKGROUND

A Phase Locked Loop (PLL) is a commonly used building block. For example, a PLL is often employed to synthesize clock signals having a frequency higher than that of some reference clock signal. They are also often employed when using a clock distribution network, so that clock signals distributed to various functional units on a die by way of the clock distribution network are synchronized with a reference or received clock signal.

Self-biased phase locked loops (SBPLL) have been a popular choice for phase locked loops. A SBPLL includes differential delay cells as building blocks. A differential delay cell is essentially a differential pair with an nMOSFET (n-Metal-Oxide-Semiconductor-Field-Effect-Transistor) current source and a pMOSFET load. A differential pair has a non-zero static current flowing through its transistors, resulting in static power consumption. Furthermore, when the low-swing differential signals in the delay chain making up the differential delay cells are converted to full-swing CMOS (Complementary-Metal-Oxide-Semiconductor) signals for clock distribution, another two stages of differential amplifiers are commonly used to provide the output clock signal, thereby consuming additional power.

In low-voltage, high-performance systems, the jitter performance of an SBPLL may not be sufficiently good enough. This is in part due to the low output impedance of short channel transistors used in the nMOSFET current sources. The voltage controlled oscillator (VCO) functional block of an SBPLL may contribute to duty cycle error because of differential pair offsets and distortion in the output level-shifter. As a result, if a 50% duty cycle is required, then either a duty cycle correction circuit (DCC) block is commonly used, or a divide-by-two frequency scheme is commonly used. In the latter case, the differential VCO runs at twice the desired output clock frequency at all process, voltage, and temperature (PVT) conditions, contributing to power consumption and additional phase jitter.

DESCRIPTION OF EMBODIMENTS

In the descriptions that follow, the scope of the term "some embodiments" is not to be so limited as to mean more than one embodiment, but rather, the scope may include one embodiment, more than one embodiment, or perhaps all embodiments.

Figure 1:
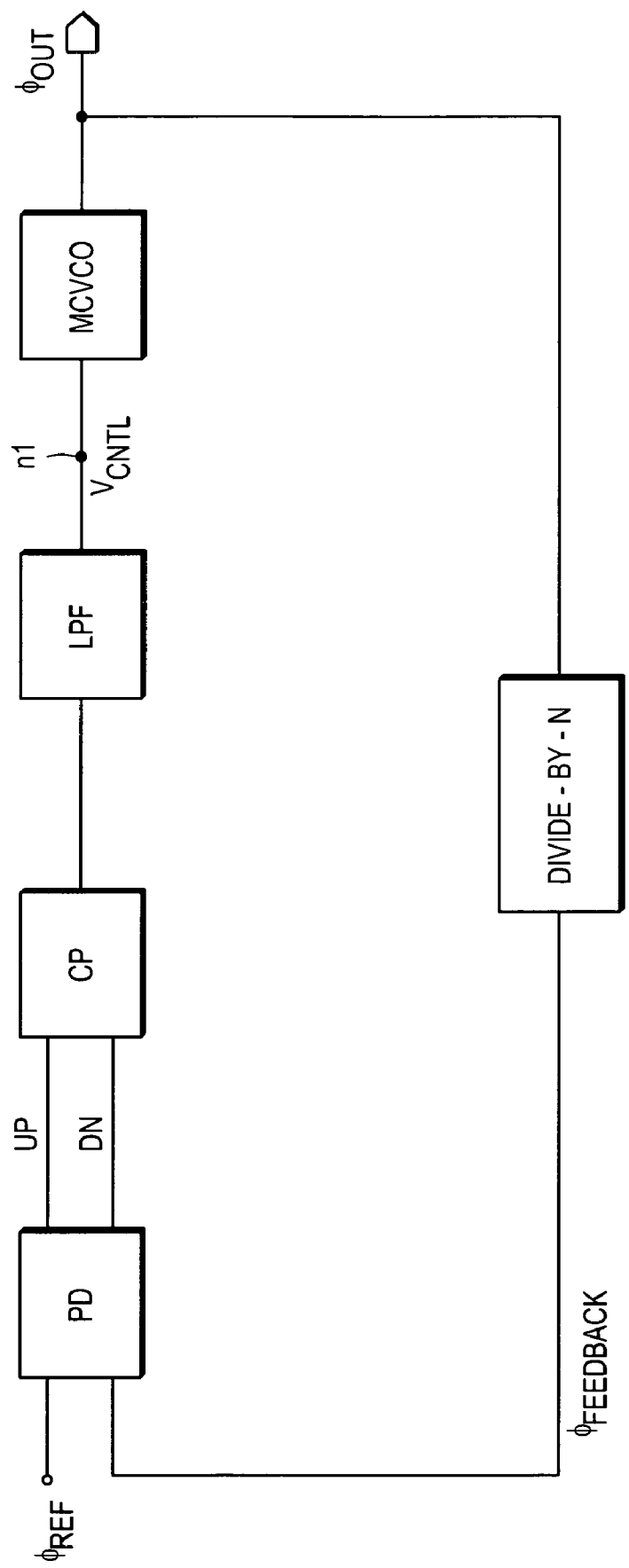
FIG. 1 illustrates a phase locked loop according to an embodiment of the present invention.

A phased locked loop according to an embodiment of the present invention is illustrated in FIG. 1. In the application of FIG. 1, Divide-By-N circuit block divides the output clock signal $\phi_{OUT}$ from MCVCO (Matched-Current-VCO) by an integer N to provide feedback clock signal $\phi_{FEEDBACK}$ to phase detector PD. The result is that when steady state lock is reached, output clock signal $\phi_{OUT}$ has a frequency N times that of the frequency of reference clock signal $\phi_{REF}$.

Clock signals $\phi_{REF}$ and $\phi_{FEEDBACK}$ are the two input signals to phase detector PD. Reference clock signal $\phi_{REF}$ may in some applications come from a clock receiver on the same die as the embodiment of FIG. 1. Phase detector PD provides UP and DN signals, depending upon the relationship between clock signals $\phi_{REF}$ and $\phi_{FEEDBACK}$. Various implementations of how the two input clock signals are compared by a phase detector may be employed, and various conventions may be followed by which the oscillation frequency of MCVCO is controlled as a function of the relationship between clock signals $\phi_{REF}$ and $\phi_{FEEDBACK}$.

For example, for some embodiments, if feedback clock signal $\phi_{FEEDBACK}$ lags reference clock signal $\phi_{REF}$, then UP signal will have wider pulses than that of DN signal, and UP signal will having a rising transition preceding the rising transition of DN signal. Conversely, if feedback clock signal $\phi_{FEEDBACK}$ leads reference clock signal $\phi_{REF}$, then DN signal will have wider pulses than that of UP signal, and its upward transitions will precede that of UP signal. UP and DN signals are provided to a charge pump so that charge is pumped into a capacitor in low pass filter LPF during those time intervals for which UP signal has wider pulses than that of DN signal, and the capacitor in low pass filter LPF is discharged during those time intervals for which DN signal has wider pulses than that of UP signal.

Low pass filter LPF is such that if its capacitor is charged, control voltage $V_{CNTL}$ at node n1 is raised, and if its capacitor is discharged, control voltage $V_{CNTL}$ is lowered. For example, if low pass filter LPF comprises a capacitor with one terminal connected to ground and the other terminal coupled to the output of charge pump CP via a resistor, then charging the capacitor increases its voltage, and discharging the capacitor decreases its voltage.

MCVCO may be designed such that an increase in control voltage $V_{CNTL}$ decreases the delay time for the delay cells making up MCVCO, resulting in an increase in MCVCO oscillation frequency, and a decrease in control voltage $V_{CNTL}$ increases the delay time for the delay cells making up MCVCO, resulting in a decrease in MCVCO oscillation frequency. In this way, the embodiment of FIG. 1 adjusts the oscillation frequency of MCVCO so that in steady state the frequency and phase of feedback clock signal $\phi_{FEEDBACK}$ matches the frequency and phase of reference clock signal $\phi_{REF}$. When this condition is satisfied, lock is achieved.

Figure 2:
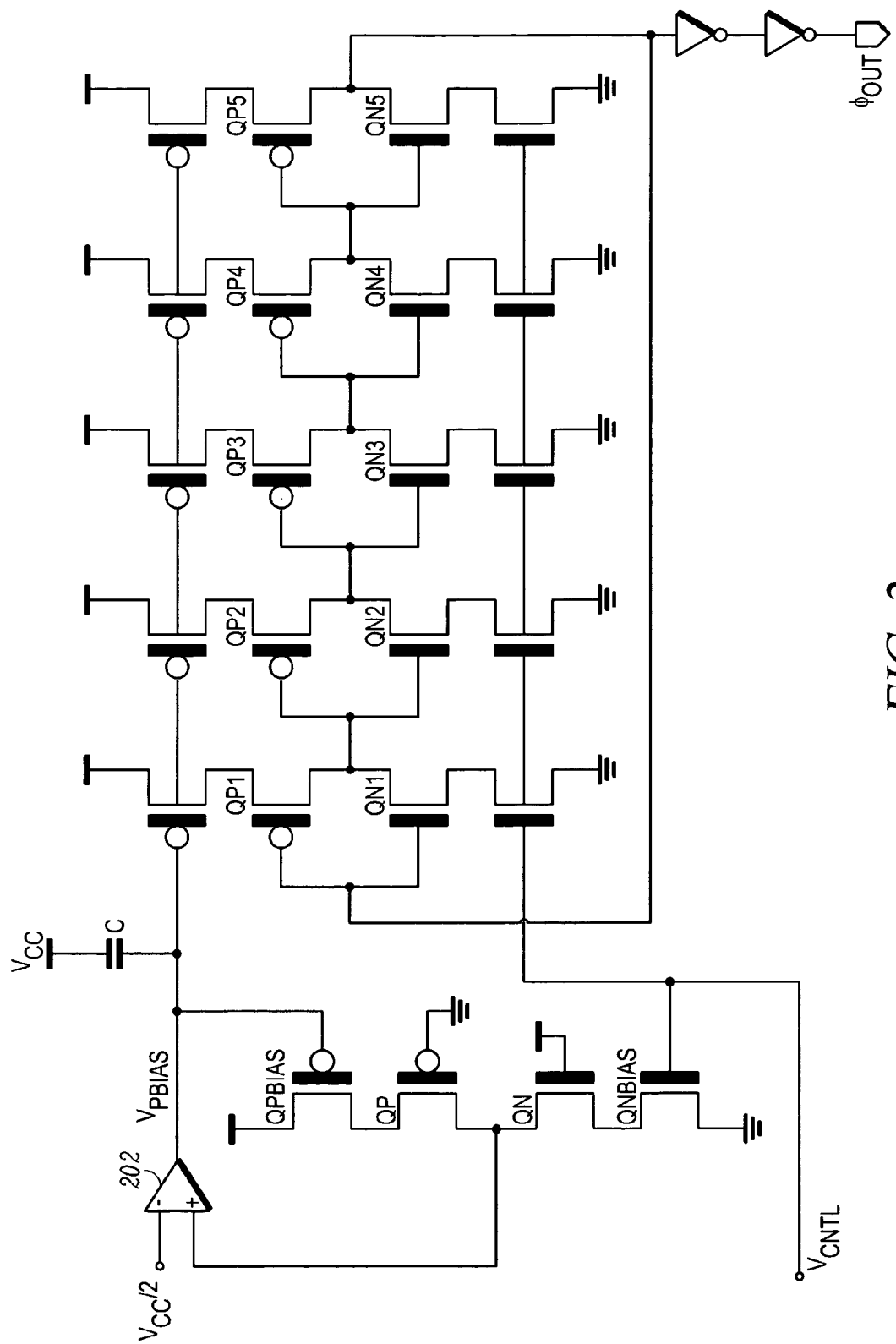
FIG. 2 illustrates a voltage controlled oscillator according to an embodiment of the present invention.

An embodiment of an MCVCO is illustrated in FIG. 2. In the particular embodiment of FIG. 2, there are five delay cells connected in a ring, where delay cell i comprises transistors QPi and QNi, where i is an index ranging from 1 to 5 referring to a delay cell, and the output port of the fifth delay cell is connected to the input port of the first delay cell. Generally, other embodiments comprise an odd number of delay cells. Each delay cell comprises an nMOSFET with a gate biased at control voltage $V_{CNTL}$, and a pMOSFET with a gate biased at a voltage $V_{PBIAS}$.

Bias voltage $V_{PBIAS}$ is generated at the output port of differential amplifier 202 by way of a feedback loop comprising differential amplifier 202 and transistors QP, QN, QPBIAS, and QNBIAS. The structure comprising transistors QP, QN, QPBIAS, and QNBIAS is similar to a delay cell. Control voltage $V_{CNTL}$ biases the gate of transistor QNBIAS, as it does for the other biased nMOSFETs in the delay cells. Bias voltage $V_{PBIAS}$ biases the gate of transistor QPBIAS, as it does for the other biased pMOSFETs in the delay cells. However, the gate of transistor QP is biased at ground (substrate) voltage $V_{SS}$, and the gate of transistor QN is biased at the supply voltage $V_{CC}$. The drains of transistors QP and QN are connected to the positive input port of differential amplifier 202. The negative input port of differential amplifier 202 is held at the voltage $V_{CC}/2$, half the supply voltage. In this way, the feedback loop adjusts the bias voltage $V_{PBIAS}$ so that the drains of transistors QP and QN are at the voltage $V_{CC}/2$.

By adjusting $V_{PBIAS}$ so that the drains of transistors QP and QN are at the voltage $V_{CC}/2$, the trip points for the delay cells are adjusted to $V_{CC}/2$, and the pull-up current provided by the biased pMOSFET in a delay cell matches the pull-down current provided by the biased nMOSFET in a delay cell across PVT. This helps maintain a 50% duty cycle, with matched rising and falling transition times for the delay cells. Furthermore, because of the coupling of the feedback loop to the supply voltage $V_{CC}$ by way of capacitor C in FIG. 2, the generation of bias voltage $V_{PBIAS}$ is coupled to the supply voltage to achieve noise tracking and cancellation. As a result, it is expected that the embodiment of FIG. 2 exhibits good jitter performance and high PSRR (Power Supply Rejection Ratio).

Although there is static current flowing through transistors QN, QP, QPBIAS, and QNBIAS, the delay cells in the embodiment in FIG. 2 are similar to CMOS inverters in that there is very little static current flowing through them. As a result, it is expected that in addition to achieving good jitter performance and high PSRR, embodiments also consume less power than prior art SBPLLs. Simulation results indicate that the power consumed by an embodiment may be in the neighborhood of 5 to 10 times less than a prior art SBPLL.

Depending on the process technology and operating frequency range, the device sizes of transistors QN, QP, QPBIAS, and QNBIAS may be different than their corresponding transistors in the delay cells, although some embodiments may have matched transistors. For example, the beta for transistor QPBIAS may be equal to the beta of the biased pMOSFETs in the delay cells; the beta for transistor QP may be equal to the beta of the transistor QPi in the delay cells; the beta for transistor QN may be equal to the beta of transistor QNi in the delay cells; and the beta for transistor QNBIAS may be equal to the beta of the biased nMOSFETs in the delay cells. In the previous sentence, channel-to-width ratio may be substituted for beta.

In other embodiments, although the betas for transistors QN, QP, QPBIAS, and QNBIAS may not match the corresponding transistors in the delay cells making up MCVCO, the relative ratios among the betas of transistors QN, QP, QPBIAS, and QNBIAS may be the same as the relative ratios among the betas of the corresponding transistors. That is, for some embodiments, the structure comprising transistors QN, QP, QPBIAS, and QNBIAS may be viewed as a scaled-down version of the delay cells in MCVCO. For some embodiments, the scale factor may be approximately 50%.

The DC (Direct Current) gain of amplifier 202 may, for some embodiments, be in the range of 10 to 20. Coupling capacitor C in FIG. 2 may be chosen to provide a phase margin of more than 45 degrees. A typical capacitance for capacitor C may be in the range of 1 pF to 2 pF.

Various types of charge pumps may be employed. For some embodiments, charge pump CP in FIG. 1 may be an adaptive charge pump in which the pull-up and pull-down currents for charging and discharging the capacitor in low pass filter LPF are matched across PVT in the same manner that the pull-up and pull-down currents in the delay cells are matched. For such an embodiment, control voltage $V_{CNTL}$ and bias voltage $V_{PBIAS}$ are made available as feedback to charge pump CP. When the phase locked loop is first turned on, a start-up circuit may be employed to charge the capacitor in low pass filter LPF so that $V_{CNTL}$ is initially at some non-zero voltage, such as for example $V_{CC}/2$.

Figure 3:
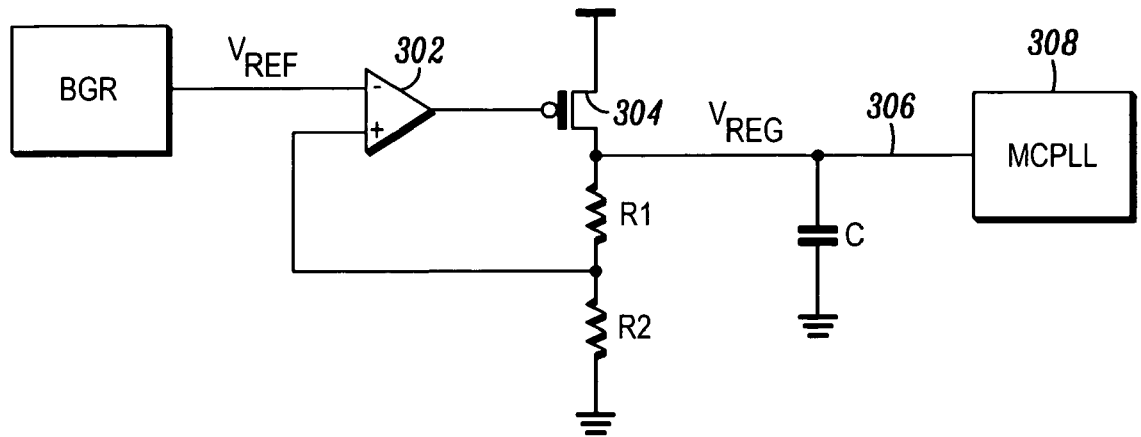
FIG. 3 illustrates an on-die voltage regulator integrated with an embodiment of the present invention.

Power supply noise jitter may be further reduced by integrating a voltage regulator on the same die as the matched current phase locked loop embodiment of FIG. 1. FIG. 3 illustrates an on-die voltage regulator to provide a regulated voltage $V_{REG}$ to MCPLL 308. BGR (Band Gap Reference) provides a voltage reference $V_{REF}$ to differential amplifier 302. With the negative feedback provided by pass transistor 304 and resistor R1, the regulated voltage, $V_{REG}$, provided at power rail 306 is $V_{REG}=V_{REF}(R1+R2)/R2$, where for convenience the symbols R1 and R2 do double duty so that R1 denotes the resistance of resistor R1, and R2 denotes the resistance of resistor R2. Capacitor C in FIG. 3 should be large enough to provide a phase margin to ensure stability, and to provide a good power supply noise rejection ratio (PSRR).

Figure 4:
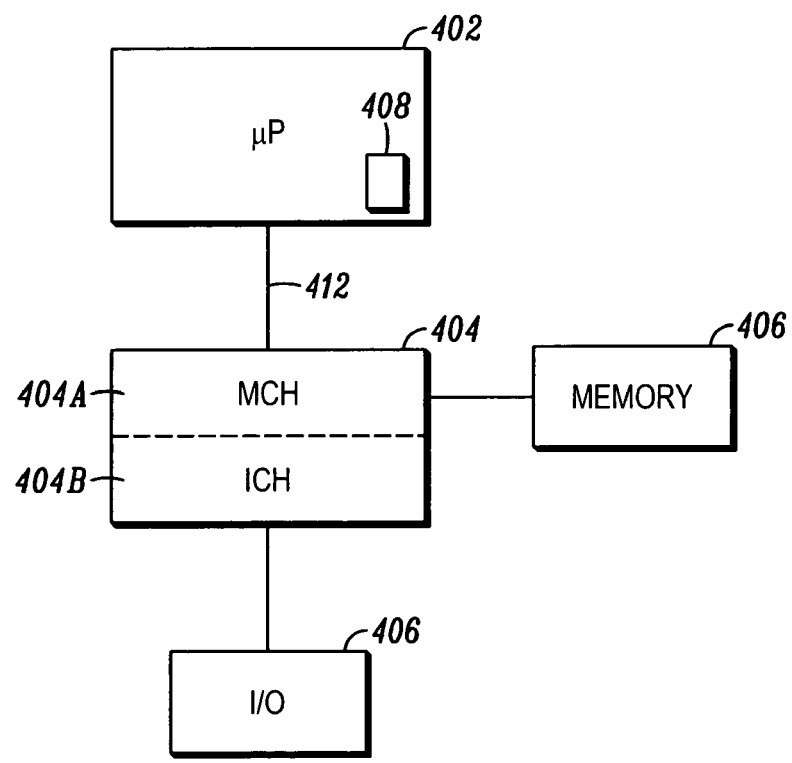
FIG. 4 illustrates a computer system employing an embodiment of the present invention.

Embodiments of the present invention are expected to find wide application in various systems. One particular application is in a computer system. FIG. 4 illustrates, in simplified form, a portion of a computer system comprising microprocessor die 402, chipset 404, and system memory 406. In the particular embodiment of FIG. 4, chipset 404 includes MCH (Memory Controller Hub) 404A and ICH (Input/Output Controller Hub) 404B. Microprocessor die 402 communicates with chipset 404 by way of bus, or transmission lines, 412. MCH 404 provides communication to system memory 406, and ICH 404B provides communication to input/output devices, collectively indicated by functional block I/O 406. Some or all of the functions provided by chipset 404 may reside on one or more distinct chips (dice), or may be integrated on microprocessor die 402. An embodiment of the present invention may be integrated on microprocessor die 402, indicated by functional block 408. Embodiments may reside in other functional units, such as chipset 404.

Various modifications may be made to the disclosed embodiments without departing from the scope of the invention as claimed below.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected together by an interconnect (transmission line). In integrated circuit technology, the interconnect may be exceedingly short, comparable to the device dimension itself. For example, the gates of two transistors may be connected together by polysilicon, or copper interconnect, where the length of the polysilicon, or copper interconnect, is comparable to the gate lengths. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

It is also to be understood in these letters patent that a "current source" may mean either a current source or a current sink. Similar remarks apply to similar phrases, such as, "to source current".

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

Various mathematical relationships may be used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. For example, it may be stated that one transistor matches another transistor, where their betas are equal to each other. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. A circuit comprising:
   a chain of delay cells comprising a first delay cell having an input port and a last delay cell comprising an output port connected to the input port of the first delay cell, each delay cell comprising a pull-up pMOSFET to provide a pull-up current when ON and a pull-down nMOSFET to provide a pull-down current when ON; and
   a feedback loop to bias the pull-up pMOSFETs so that for each delay cell the pull-up current matches the pull-down current, the feedback loop comprising a differential amplifier comprising an output port to bias the pull-up pMOSFETs of the delay cells, and
   further comprising a pull-up pMOSFET to provide a pull-up current when ON, and a pull-down nMOSFET to provide a pull-down current when ON; wherein the pull-up pMOSFET in the feedback loop is matched to each of the pull-up pMOSFETs in the delay cells, and the pull-down nMOSFET in the feedback loop is matched to each of the pull-down nMOSFETs in the delay cells.

2. The circuit as set forth in claim 1, further comprising:
   a power supply rail; and
   a capacitor connected to the power supply rail and the output port of the differential amplifier.

3. The circuit as set forth in claim 2, wherein each of the pull-down nMOSFETs in the delay cells comprises a gate, the circuit further comprising:
   a phase detector;
   a charge pump coupled to the phase detector; and
   a low pass filter coupled to the charge pump to provide a control voltage on each of the gates of the pull-down nMOSFETs.

4. A circuit comprising:
   a set of delay cells connected in a ring, each delay cell comprising
      a pull-up pMOSFET comprising a gate;
      a pull-down nMOSFET comprising a gate;
      a pMOSFET; and
      an nMOSFET; and
   a feedback loop comprising
      a differential amplifier comprising a positive input port, a negative input port, and an output port connected to the gates of the pull-up pMOSFETs of the delay cells;
      a pull-up pMOSFET comprising a gate connected to the output port of the differential amplifier;
      a pull-down nMOSFET comprising a gate connected to the gates of the pull-down nMOSFETs of the delay cells;
      a pMOSFET comprising a drain connected to the positive input port of the differential amplifier; and
      an nMOSFET comprising a drain connected to the positive input port of the differential amplifier; wherein
   the pull-up pMOSFET of the feedback loop is matched to the pull-up pMOSFETs of the delay cells;
   the pull-down nMOSFET of the feedback loop is matched to the pull-down nMOSFETs of the delay cells;
   the pMOSFET of the feedback loop is matched to the pMOSFETs of the delay cells; and
   the nMOSFET of the feedback loop is matched to the nMOSFETs of the delay cells.

5. The circuit as set forth in claim 4, further comprising:
   a power rail to provide a supply voltage $V_{cc}$; and
   a ground rail to provide a substrate voltage $V_{ss}$; wherein
   the pull-up pMOSFET in each delay cell and in the feedback loop comprises a source connected to the power rail;
   the pull-down nMOSFET in each delay cell and in the feedback loop comprises a source connected to the ground rail;
   the pMOSFET of the feedback loop comprises a gate connected to the ground rail; and
   the nMOSFET of the feedback loop comprises a gate connected to the power rail.

6. The circuit as set forth in claim 5, where the negative input port of the differential amplifier is coupled to the power rail to provide a voltage $V_{cc}/2$ on the negative input port.

7. The circuit as set forth in claim 4, further comprising:
   a phase detector;
   a charge pump coupled to the phase detector; and
   a low pass filter coupled to the charge pump to bias the gates of the pull-down nMOSFET in each delay cell; wherein the pull-up pMOSFET in each delay cell and the pull-up pMOSFET in the feedback loop comprises a source at a voltage, and the pull-down nMOSFET in each delay cell and the pull-down nMOSFET in the feedback loop comprises a source at a voltage; the feedback loop to bias the gates of the pull-up pMOSFET in each delay cell when the negative input port of the differential amplifier is held at a voltage halfway between the voltage of the sources of the pull-up pMOSFETs and the voltage of the sources of the pull-down nMOSFETs.

8. The circuit as set forth in claim 4, further comprising:
   a phase detector;
   a charge pump coupled to the phase detector; and
   a low pass filter coupled to the charge pump to bias the gates of the pull-down nMOSFET in each delay cell, the feedback loop coupled to the delay cells so that the pull-up pMOSFET in each delay cell provides a pull-up current when ON matched to a pull-down current provided by the pull-down nMOSFET in each delay cell when ON.

9. The circuit as set forth in claim 4, the feedback loop coupled to the delay cells so that the pull-up pMOSFET in each delay cell provides a pull-up current when ON matched to a pull-down current provided by the pull-down nMOSFET in each delay cell when ON.

10. A computer system comprising, system memory;

a memory controller in coupled to the system memory; and a microprocessor coupled to the memory controller; and microprocessor comprising a chain of delay cells comprising a first delay cell having an input port and a last delay cell comprising an output port connected to the input port of the first delay cell, each delay cell comprising a pull-up pMOSFET to provide a pull-up current when ON and a pull-down nMOSFET to provide a pull-down current when ON; and a feedback loop to bias the pull-up pMOSFETs so that for each delay cell the pull-up current matches the pull-down current, the feedback loop comprising a differential amplifier comprising an output port to bias the pull-up pMOSFETs of the delay cells; the feedback loop further comprising a pull-up pMOSFET to provide a pull-up current when ON, and a pull-down nMOSFET to provide a pull-down current when ON; wherein the pull-up pMOSFET in the feedback loop is matched to each of the pull-up pMOSFETs in the delay cells, and the pull-down nMOSFET in the feedback loop is matched to each of the pull-down nMOSFETs in the delay cells.

11. The computer system as set forth in claim 10, further comprising:

a power supply rail; and a capacitor connected to the power supply rail and the output port of the differential amplifier.

* * * * *